United States Patent
Clem

[11] Patent Number: 5,257,167
[45] Date of Patent: * Oct. 26, 1993

[54] SILHOUETTE ILLUMINATED VEHICLE DISPLAY APPARATUS

[75] Inventor: James M. Clem, Macy, Ind.

[73] Assignee: Delco Electronics Corporation, Kokomo, Ind.

[*] Notice: The portion of the term of this patent subsequent to Feb. 5, 2008 has been disclaimed.

[21] Appl. No.: 399,563

[22] Filed: Aug. 24, 1989

[51] Int. Cl.⁵ .............................................. G01D 11/28
[52] U.S. Cl. ........................................ 362/27; 362/23; 362/30; 116/286
[58] Field of Search .................. 340/815.06, 815.17, 340/815.19, 815.26, 716, 781, 767, 793, 753, 870.2, 936; 116/46, 47, 49, 286, 287, 288; 362/28, 29, 23, 30, 31; 40/544; 350/345

[56] References Cited

U.S. PATENT DOCUMENTS

| | | | |
|---|---|---|---|
| 1,743,401 | 1/1930 | Schlaich | 362/23 |
| 1,823,868 | 9/1931 | Zubaty | 40/443 |
| 2,953,668 | 9/1960 | Bassett, Jr. | 200/167 |
| 3,267,598 | 8/1966 | Olesen et al. | 40/130 |
| 4,044,708 | 8/1977 | Klein | 116/129 |
| 4,236,480 | 12/1980 | Gröhl | 362/29 |
| 4,559,582 | 12/1985 | Scardilli et al. | 362/23 |
| 4,621,306 | 11/1986 | Sell | 362/23 |
| 4,838,661 | 6/1989 | McKee et al. | 350/337 |
| 4,845,595 | 7/1989 | Fujii et al. | 362/30 |
| 4,959,759 | 9/1990 | Kohler | 362/29 |
| 4,991,064 | 2/1991 | Clem | 362/27 |

FOREIGN PATENT DOCUMENTS 0078372 7/1985 European Pat. Off. .
711167 6/1954 United Kingdom .
1445840 8/1976 United Kingdom .

OTHER PUBLICATIONS

Road & Track, Nissan Maxima SE, Apr. 1989, pp. 146-148.

Primary Examiner—Alvin E. Oberley
Assistant Examiner—Chanh Nguyen
Attorney, Agent, or Firm—Mark A. Navarre

[57] ABSTRACT

An improved vehicle display apparatus in which both the display and pointer are illuminated for low ambient driver viewing by a single electroluminescent (EL) lamp mounted on the rear face of the display. A generally opaque applique includes a translucent region in registry with the active area of the EL lamp, and bright opaque graphic symbols painted or deposited onto a surface of the applique within the translucent region. A pointer disposed in proximity to the front surface of the applique is provided with juxtaposed bright opaque and transparent regions. In high ambient lighting conditions when the EL lamp is not lit, a viewer of the display perceives the bright opaque graphic symbols and pointer stripes against the relatively dark translucent background regions of the applique. In low ambient lighting conditions when the EL lamp is lit, the viewer perceives the opaque graphic symbols and pointer stripes in silhouette against the relatively bright translucent regions of the applique and pointer, respectively.

4 Claims, 2 Drawing Sheets

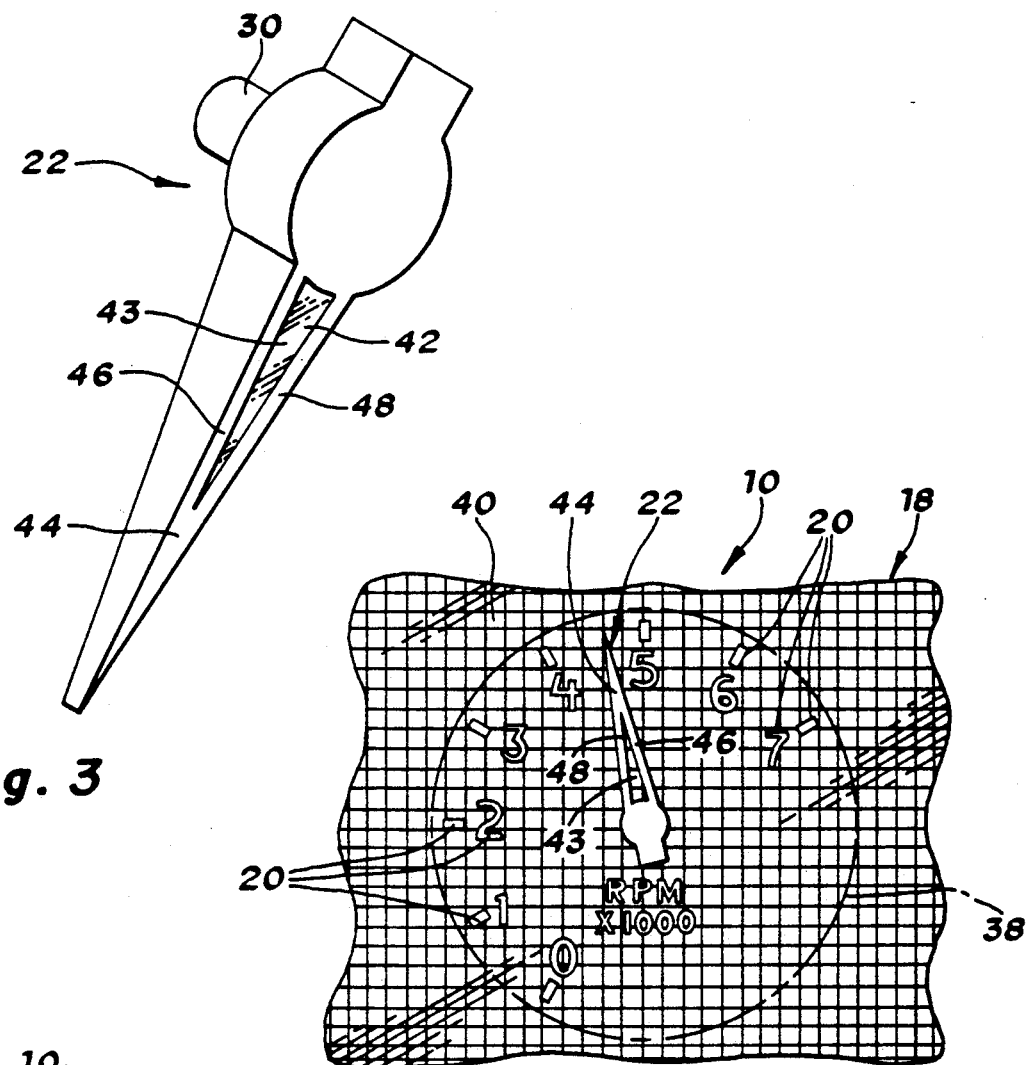
Fig. 4
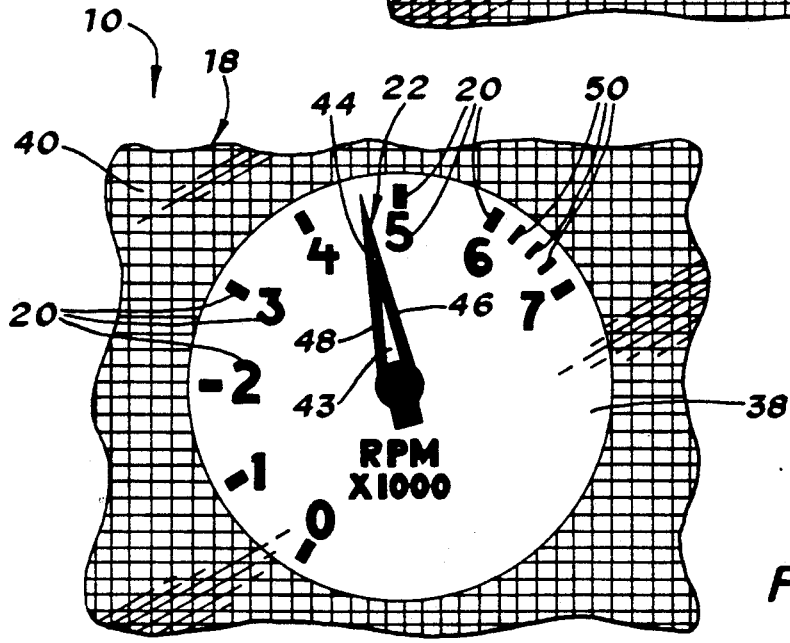
Fig. 3
Fig. 5

SILHOUETTE ILLUMINATED VEHICLE DISPLAY APPARATUS

This invention relates to vehicle instrument panel displays, and more particularly, to a display illumination apparatus which causes the display graphics and pointer to appear in silhouette when the display is illuminated for driver viewing during low ambient lighting conditions.

BACKGROUND OF THE INVENTION

Illumination of vehicle instrument panel nonemissive displays for driver viewing during low ambient lighting conditions is typically achieved with front-lighting or flood-lighting techniques in which a light source is directed onto the front face of the display. Unfortunately, this technique causes significant heating and the display pointer tends to shadow the face of the display. As an alternative, the display may be back-lit by directing a light source onto the rear face of the display, thereby lighting portions of the display which are normally dark, but then the pointer must be separately lit by either front-lighting or light-piping techniques. Front-lighting has drawbacks in terms of heating and shadowing, as described above, and tends to defeat the back-lighting effect, while light-piping has drawbacks in terms of weight, cost and packaging.

SUMMARY OF THE PRESENT INVENTION

The present invention is directed to an improved vehicle display apparatus in which both the display and pointer are illuminated for low ambient driver viewing by a single electroluminescent (EL) lamp mounted on the rear face of the display. The display comprises a generally opaque applique having a translucent region in registry with the active area of the EL lamp, and bright opaque graphic symbols painted or deposited onto a surface of the applique within the translucent region. A pointer disposed in proximity to the front surface of the applique is provided with juxtaposed bright opaque and translucent/transparent stripes.

In high ambient lighting conditions, the EL lamp is not lit and the bright opaque portions of the display dominate. In this case, a viewer of the display perceives the bright opaque graphic symbols and pointer stripes against the relatively dark translucent background regions of the applique. In low ambient lighting conditions, the EL lamp is lit and the translucent portions of the display dominate. In this case, the viewer perceives the opaque graphic symbols and pointer stripes in silhouette against the relatively bright translucent regions of the applique and pointer, respectively. No separate pointer lighting is required since light from the translucent region passes through the translucent/transparent stripe of the pointer.

Thus, the display of the present invention overcomes the drawbacks of the prior displays. The EL lamp produces much less heat than other, more directed light sources, the pointer does not shadow the face of the display, the cost is relatively low, and packaging is simplified because light-piping is not required.

BRIEF DESCRIPTION OF THE DRAWINGS

FIG. 3 is an enlarged view of the pointer of FIG. 1.

FIGS. 4 and 5 illustrate a portion of the display as perceived by a viewer during high and low ambient lighting conditions, respectively.

DETAILED DESCRIPTION OF THE DRAWINGS

Figure 1:
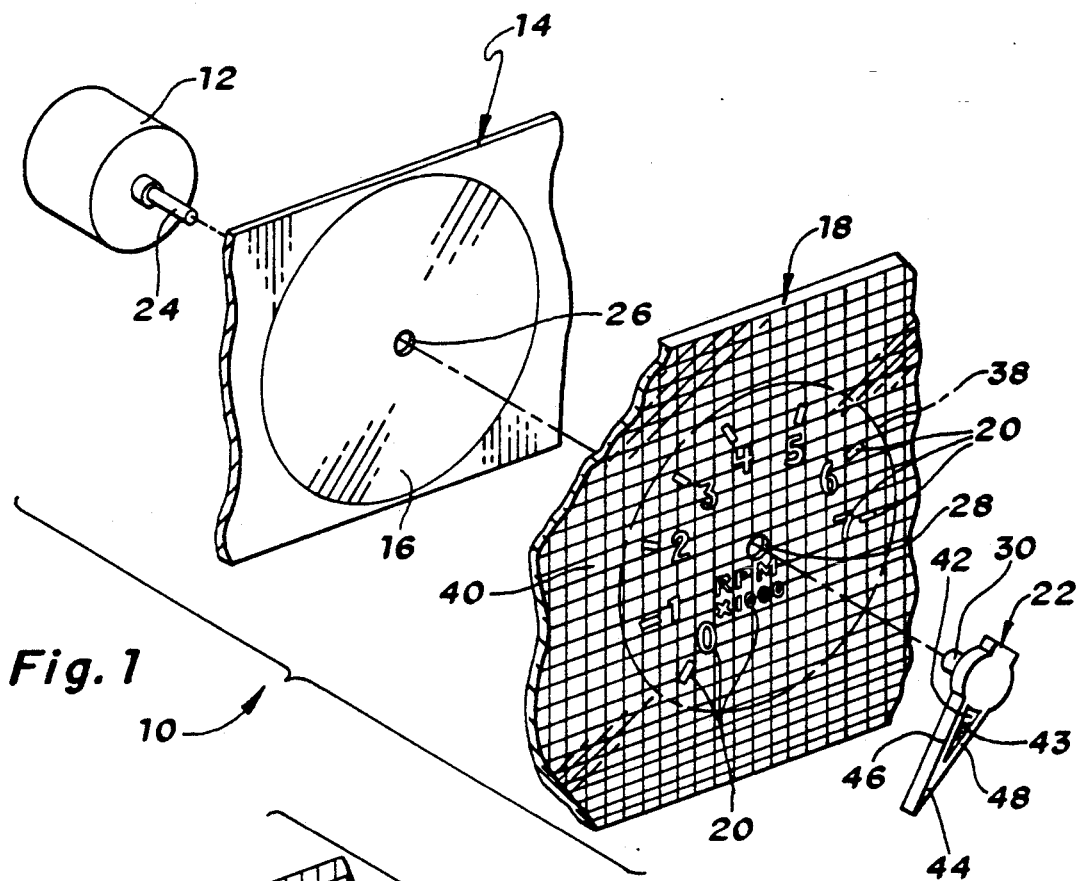
FIG. 1 is an exploded view of a display according to this invention, including the pointer and driver, the EL lamp and the applique.

Referring to FIG. 1, the reference numeral 10 generally designates the elements of a vehicle instrument panel display according to this invention. The display 10 comprises a rotary actuator 12, such as a conventional air core gauge mechanism, an EL lamp 14 having an active light emitting region 16, an applique 18 having bright opaque graphic symbols 20 painted or deposited on the surface thereof, and a rotatable pointer 22. The applique 18 is mounted on the lamp 14 such that the graphic symbols 20 fall within the active region 16. The rotary output shaft 24 of actuator 12 extends through central openings 26, 28 in lamp 14 and applique 18 for attachment to the hub 30 of pointer 22.

Figure 2:
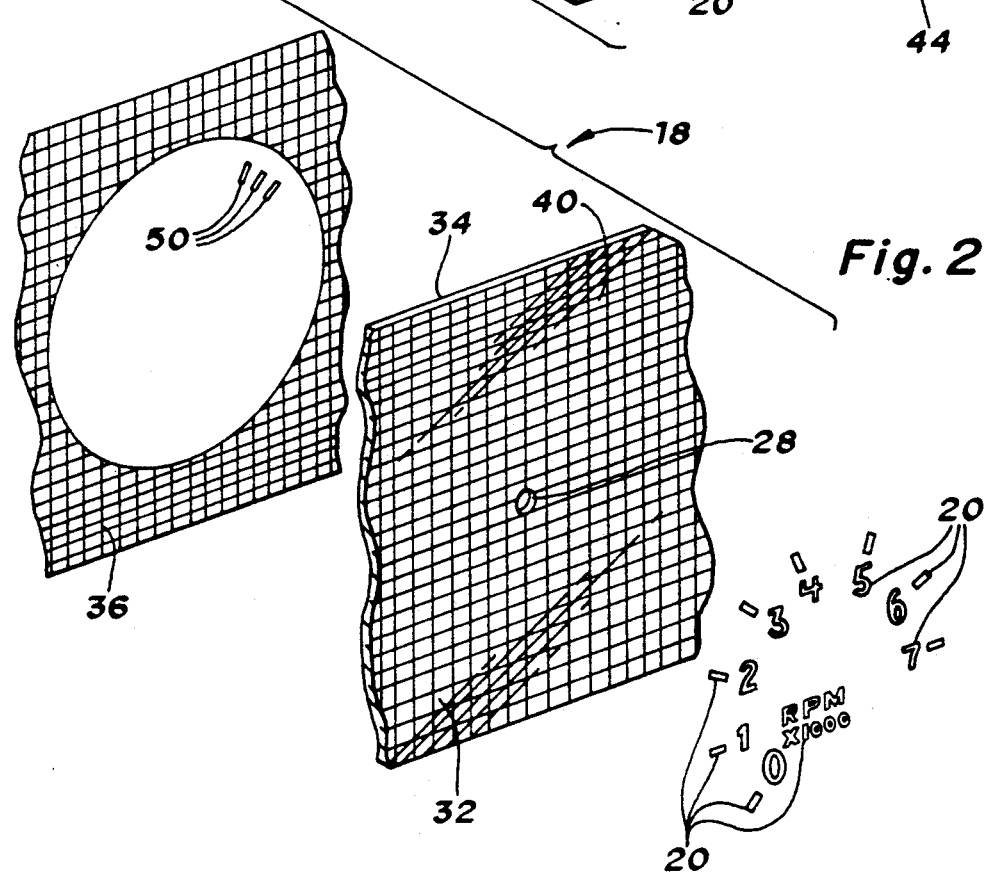
FIG. 2 is a schematic illustration of the applique of FIG. 1.

Referring additionally to FIG. 2, it is seen that the applique 18 is a multi-layered film. The base film 32 preferably comprises a translucent or neutral density material, such as 35% transmissivity polycarbonate. The rear face 34 of the base film 32 is coated with an opaque material 36 in the areas which would lie outside the active region 16 of EL lamp 14, leaving a translucent region 38 which corresponds to and lies in registry with the active lamp region 16 in the assembled display. The graphic symbols 20 are painted or deposited on the front face 40 of the base film, using a bright opaque material In the preferred embodiment, the white and/or orange color material is used to form the graphic symbols 20 in order to achieve high contrast against the relatively dark translucent region 38 when the lamp 14 is not lit.

As seen more clearly in FIG. 3, the pointer 22 is predominantly opaque, with the exception of a generally transparent region 42 along the length of the pointer stem 44. Alternatively, the region 42 may be formed by a physical opening in the stem 44. As with the graphic symbols 20, the opaque area of the pointer 22 is colored brightly to achieve high contrast against the relatively dark translucent region 38 of applique 18 when the EL lamp 14 is not lit. In the preferred embodiment, the opaque areas of the pointer 22 are white or orange. To a viewer of the display 10, the stem 44 of pointer 22 is thus perceived as a pair of like color stripes 46 and 48 separated by a center contrasting stripe 43.

FIGS. 4 and 5 illustrate a viewers perception of the display 10 in high and low ambient lighting conditions, respectively. It is assumed that the EL lamp 14 is unlit in the high ambient lighting conditions of FIG. 4, and lit in the low ambient lighting conditions of FIG. 5.

In the high ambient lighting conditions of FIG. 4, the bright opaque portions of the display 10 dominate the perception of the viewer. In this case, the viewer perceives the bright opaque graphic symbols 20 and bright opaque pointer stripes 46, 48 against the relatively dark translucent region 38 of the applique 18. The central pointer stripe defined by the transparent region 42 appears just as dark as the region 38.

In the low ambient lighting conditions of FIG. 5, the translucent and transparent portions of the display 10 dominate the perception of the viewer. In this case, the viewer perceives the opaque graphic symbols 20 and outer pointer stripes 46, 48 in silhouette against the relatively bright translucent and transparent regions 38 and 42 of applique 18 and pointer 22, respectively.

If desired, opaque graphic symbols may also be painted or deposited on the rear face of the base film 32 within the translucent region 38, as indicated by the reference numeral 50 in FIG. 2. Such symbols would not be perceived by a viewer during high ambient conditions when the lamp 14 is unlit (especially if the symbol color is not highly contrasted with the dark translucent region 38), but would be perceived in silhouette against the region 38 during low ambient conditions when the lamp 14 is lit as indicated by the minor division graphic marks 50 in FIG. 5.

Additionally, it may be desired to eliminate the transparent region 44 of pointer 22, and instead coat the entire face of the pointer 22 with a bright opaque material. In this case, the the entire pointer 22 would be perceived in silhouette against the bright translucent region 38 when the lamp 14 is lit during low ambient lighting conditions.

In the transition between low and high ambient lighting conditions, such as at dawn or dusk, the contrast between the graphic symbols 20 and the translucent region 38 is somewhat decreased when the lamp 14 is lit. The reduced contrast is acceptable, but may be improved by employing a fluorescent opaque material to paint/coat the graphic symbols 20 and pointer 44.

While this invention has been described in reference to the illustrated embodiments, it is expected that various modifications will occur to those skilled in the art, and that displays incorporating such modifications may fall within the scope of the present invention, which is defined by the appended claims.

The embodiments of the invention in which an exclusive property or privilege is claimed are defined as follows:

1. Motor vehicle instrument panel display apparatus adapted to be viewed by a vehicle occupant during both high and low ambient lighting conditions, comprising:

instrument panel mounted film means including a translucent display region and bright opaque graphic symbols formed on a surface of said display region which faces toward the viewing occupant so that in high ambient lighting conditions, the occupant perceives the bright opaque graphic symbols against the translucent display region; and electroluminescent lamp means having an active region which when activated emits diffuse light onto the surface of the film means which faces away from the occupant, at least in the vicinity of said translucent display region, so that when the lamp means is activated during low ambient lighting conditions, the occupant perceives the graphic symbols in silhouette against the lighted translucent display region of said film means.

2. The apparatus set forth in claim 1, further comprising:

pointer means disposed in proximity to the occupant facing surface of said translucent display region of said film means between the occupant and said film means, the pointer having a brightly colored opaque stem which (1) is readily perceived by the occupant against the translucent display region during high ambient lighting conditions when said lamp is not activated, but (2) is silhouetted against the lighted translucent display region of said film means when the lamp means is activated during low ambient lighting conditions.

3. The apparatus set forth in claim 2, wherein:

the stem of said pointer is defined by a pair of brightly colored opaque regions separated by a generally transparent region, so that the transparent region appears (1) dark in high ambient lighting conditions when the lamp is not activated, and (2) lighted in low ambient lighting conditions when the lamp is activated.

4. The apparatus set forth in claim 1, wherein:

the film means includes opaque graphic symbols formed within said translucent display region on the surface thereof which faces away from the occupant, so that such symbols (1) are not perceived by the occupant in high ambient lighting conditions when the lamp is not activated, but (2) are perceived in silhouette against the translucent display region in low ambient lighting conditions when the lamp is activated.

* * * * *